(12) United States Patent
Coronel et al.

(10) Patent No.: US 8,460,978 B2
(45) Date of Patent: Jun. 11, 2013

(54) METHOD FOR MANUFACTURING A TRANSISTOR WITH PARALLEL SEMICONDUCTOR NANOFINGERS

(75) Inventors: Philippe Coronel, Barraux (FR); Jessy Bustos, Le Touvet (FR); Romain Wacquez, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 854 days.

(21) Appl. No.: 12/063,288

(22) PCT Filed: Aug. 7, 2006

(86) PCT No.: PCT/FR2006/050790
§ 371 (c)(1),
(2), (4) Date: Mar. 23, 2010

(87) PCT Pub. No.: WO2007/017613
PCT Pub. Date: Feb. 15, 2007

(65) Prior Publication Data
US 2010/0184274 A1      Jul. 22, 2010

(30) Foreign Application Priority Data

Aug. 8, 2005 (FR) ...................................... 05 52460

(51) Int. Cl.
*H01L 21/00* (2006.01)
*H01L 27/01* (2006.01)
(52) U.S. Cl.
USPC .......................... 438/149; 438/161; 257/347

(58) Field of Classification Search
USPC .......... 438/149, 161, 421, 422, 479; 257/347, 257/349, 350, 351
See application file for complete search history.

(56) References Cited

U.S. PATENT DOCUMENTS

| | | | |
|---|---|---|---|
| 6,713,356 B1 | 3/2004 | Skotnicki |
| 2002/0149031 A1 | 10/2002 | Kim et al. |
| 2004/0016968 A1 | 1/2004 | Coronel |
| 2004/0166642 A1 | 8/2004 | Chen et al. |
| 2004/0209463 A1 | 10/2004 | Kim et al. |

OTHER PUBLICATIONS

International Search Report from corresponding International Application No. PCT/FR2006/050790.

*Primary Examiner* — Kevin M Picardat
(74) *Attorney, Agent, or Firm* — Wolf, Greenfield & Sacks, P.C.

(57) ABSTRACT

A method of producing a transistor having parallel semiconductor nanofingers. The method includes: forming a monocrystalline layer of a semiconductor material on a layer of a subjacent material which can be selectively etched in relation to the monocrystalline layer; etching parallel partitions in the monocrystalline layer and in the subjacent layer and continuing said etching operation in order to hollow out part of the subjacent layer of material; filling the gap between the partitions and the hollowed-out part with a first insulating material; defining a central part of the partitions and removing the first insulating material from around the central part of the monocrystalline layer, thereby forming a finger of semiconductor material; and filling and coating the central part with a conductor material.

29 Claims, 4 Drawing Sheets

METHOD FOR MANUFACTURING A TRANSISTOR WITH PARALLEL SEMICONDUCTOR NANOFINGERS

FIELD OF THE INVENTION

The present invention relates to semiconductor component manufacturing techniques.

DISCUSSION OF THE RELATED ART

In the field of semiconductor components, transistors having an active portion (channel, base) completely surrounded with a control electrode enabling, according to its bias state, setting the transistor to an on or off state, are known.

US Patent Application 2002/0149031 (Samsung) discloses a transistor comprising a silicon nanofinger fully surrounded with a gate electrode. This transistor has various drawbacks, in particular as regards the high value of the gate-source and gate-drain capacitances.

SUMMARY OF THE INVENTION

Thus, an object of the present invention is to overcome at least some of the disadvantages of the methods resulting in the above-mentioned devices.

Another object of the present invention is to provide a method for manufacturing a transistor with parallel semiconductor nanofingers which is particularly efficient and simple to implement and that provides low gate-source and gate-drain capacitances.

To achieve these and other objects, the present invention provides a method for manufacturing a transistor with semiconductor nanofingers in parallel, comprising:

forming a single-crystal layer of a semiconductor material on a layer of an underlying material selectively etchable with respect to the single-crystal layer;

etching parallel walls in the single-crystal layer and in the underlying layer and etching away a portion of said layer of an underlying material;

filling the interval between the walls and the etched away portion with a first insulating material;

delimiting a central portion of the walls and eliminating the first insulating material around the central portion of said single-crystal layer, whereby a finger of said semiconductor material is formed; and filling and coating the central portion with a conductive material.

According to an embodiment of the present invention, the walls have a width smaller than 100 nm, preferably smaller than 50 nm.

According to an embodiment of the present invention, the method comprises, before the step of filling with a conductive material, the step of coating with a second insulating material (22) the finger periphery.

According to an embodiment of the present invention, the coating with an insulator comprises a thermal oxidation.

According to an embodiment of the present invention, the method comprises, before the step of filling with a conductive material, the step of performing an anneal to round the finger periphery.

According to an embodiment of the present invention, the semiconductor layer is a silicon layer and the underlying layer is a silicon-germanium layer.

According to an embodiment of the present invention, the silicon-germanium layer rests on a thin lower silicon layer forming the upper portion of an SOI-type structure and, in the finger etch step, fingers are also formed in the lower layer.

According to an embodiment of the present invention, the method provides several semiconductor finger stages.

BRIEF DESCRIPTION OF THE DRAWINGS

The foregoing and other objects, features, and advantages of the present invention will be discussed in detail in the following non-limiting description of specific embodiments in connection with the accompanying drawings.

DETAILED DESCRIPTION

Figure 1:
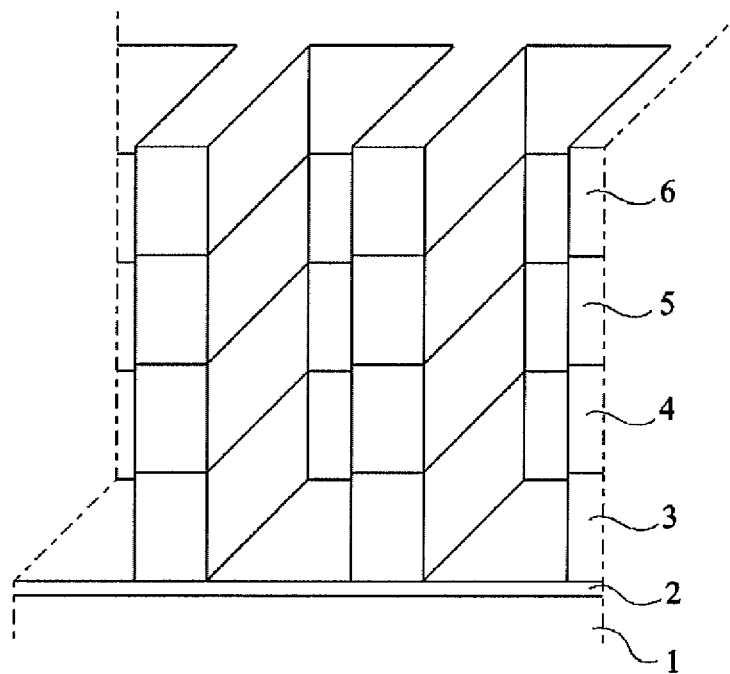
FIG. 1 is a partial perspective view of a structure according to the present invention at an intermediary manufacturing stage.

FIG. 1 is a perspective view of a structure at an intermediary manufacturing step according to an example of implementation of the method according to the present invention. In this example of implementation, it is started from a structure currently commonly available for sale, called an SOI wafer, comprising on a silicon substrate 1 a thin insulating layer 2, currently silicon oxide, and a single-crystal silicon layer 3. On single-crystal silicon layer 3, a single-crystal silicon-germanium layer 4 and a single-crystal silicon layer 5 have successively been grown. The assembly is coated with a layer used as a hard etch mask 6, currently silicon nitride. This hard mask is etched according to the pattern shown in top view in FIG. 2, to define openings 11 between walls 12 which extend from a block 13 to a block 14.

According to an aspect of the invention, during the formation of openings 11 between the walls 12, the silicon-germanium 4 is etched away in the walls 12 and partially outside openings 11, as shown by the dashed lines 15 under blocks 13 and 14.

Figure 2:
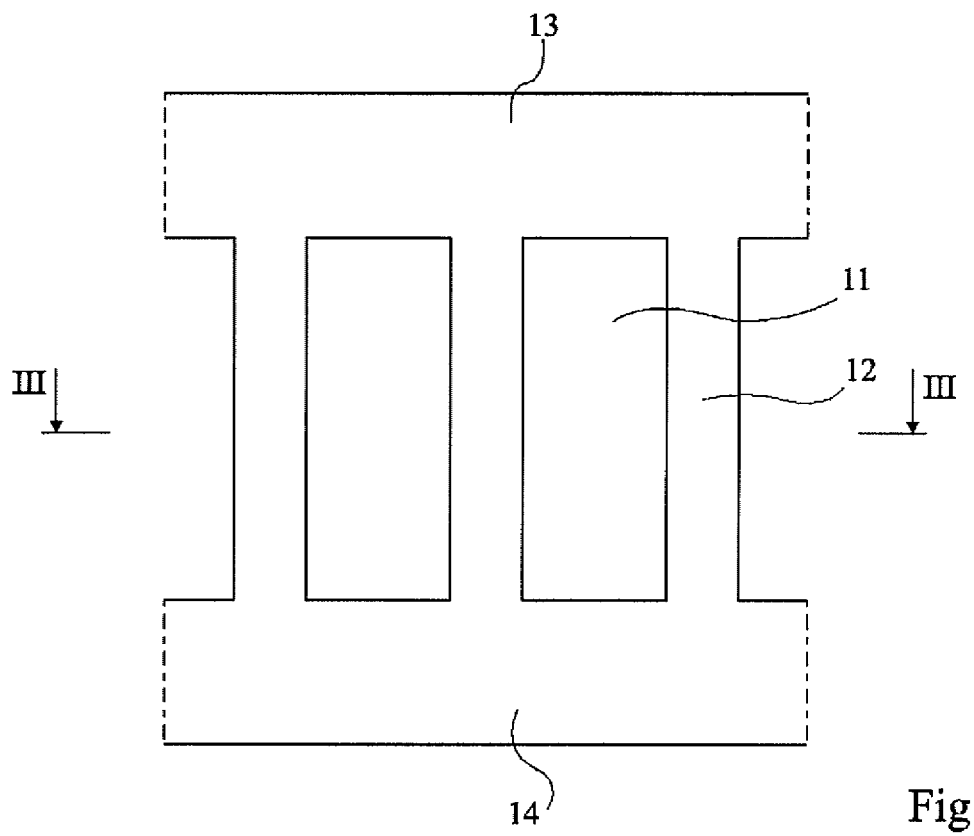
FIG. 2 is a partial top view corresponding to FIG. 1.
Figure 3A:
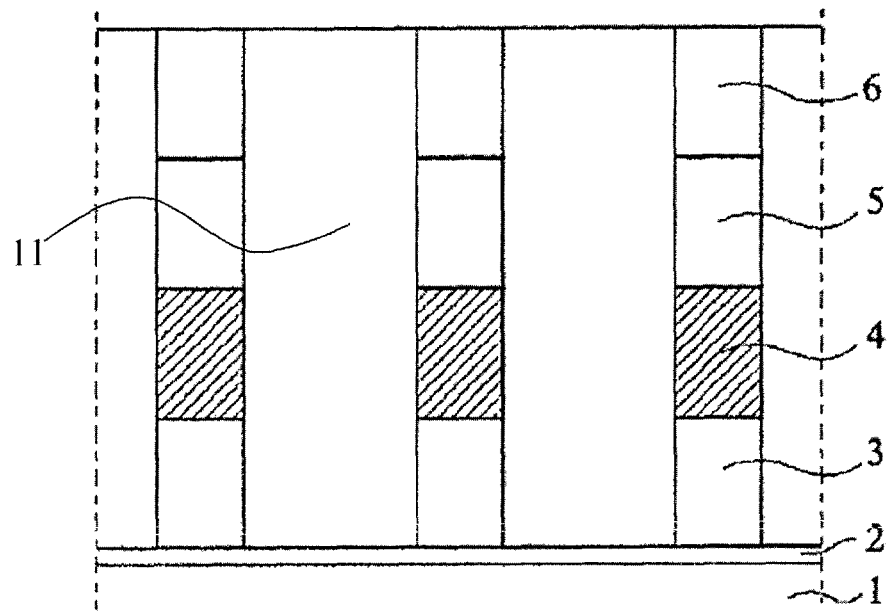
FIG. 3A is a cross-section view along line III-III of FIG. 2, corresponding to FIG. 1.

As illustrated in the perspective view of FIG. 1 and the cross-section view of FIG. 3, which is a cross-section along plane III-III of FIG. 2, each wall extends vertically down to insulating layer 2 and thus comprises the superposition of corresponding portions of single-crystal silicon layer 3, of single-crystal silicon layer 5, and of hard mask 6 single-crystal silicon-germanium layer 4 has been etched away, see FIG. 3A. Similarly, each of blocks 13 and 14 comprises a portion of the stacking of layers 3, 5, and 6.

Figure 3B:
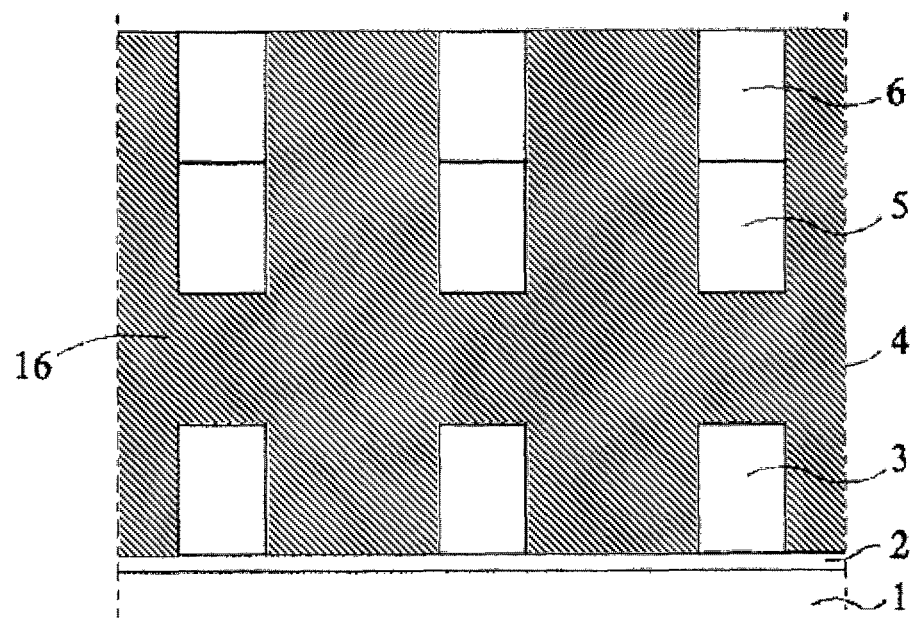
FIG. 3B is a cross-sectional view of the structure of FIG. 3A filled with an insulating material.

The result of a subsequent step during which openings 11 have been filled between walls 12 with an insulating material 16 selectively etchable with respect to the various materials forming walls 12 as illustrated in FIG. 3B. Insulating material 16 may for example be silicon oxide deposited by chemical vapor deposition, the deposition step being followed by a physico-chemical polishing step to bring the upper surface of material 16 to the level of the upper surface of hard mask 6. It will be understood that the insulating material fills in the spaces from which portions of the silicon-germanium layer 4 have been etched away.

Figure 4:
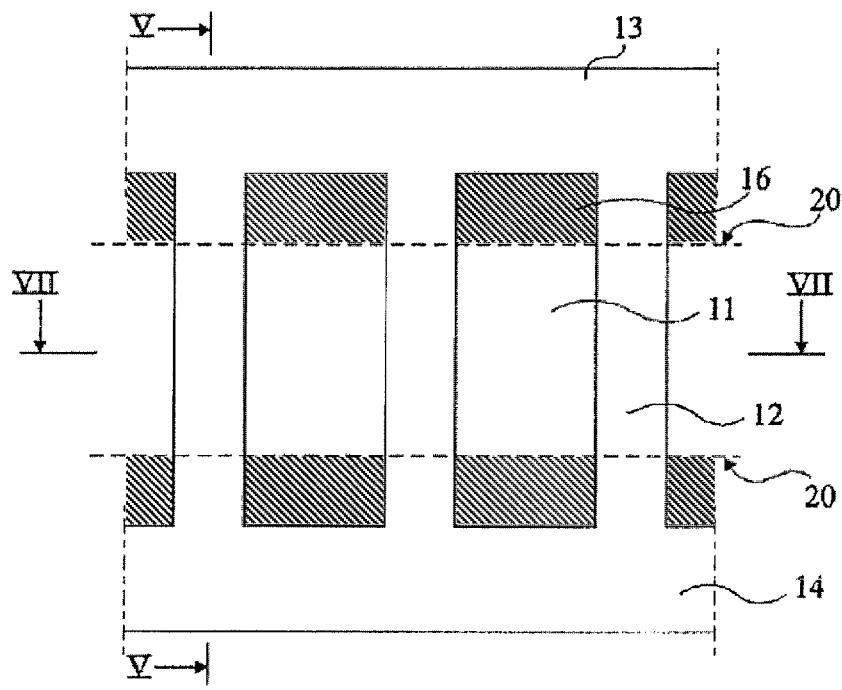
FIG. 4 is a top view showing the structure at a subsequent manufacturing step.

Then, as illustrated in the top view of FIG. 4, the portion external to a central area of the walls is masked according to the contour designated by dotted lines 20. Previously-described hard mask 6 and all of insulating material 16 is then eliminated between dotted lines 20. The etching of insulator 16 is carried on down to insulating layer 2. The central portion of walls 12 has thus been disengaged across the entire length and depth of this central area.

Figure 5:
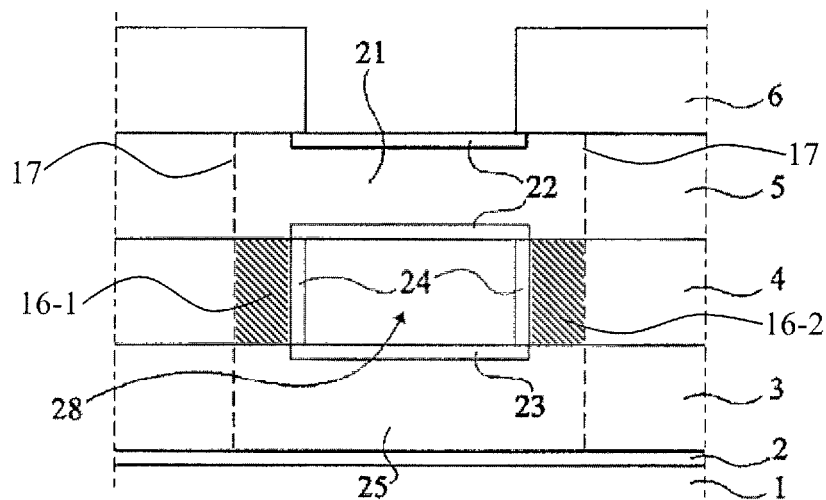
FIG. 5 is a cross-section view along line V-V of FIG. 4 at a subsequent manufacturing stage.

FIG. 5 is a cross-section view along line V-V of FIG. 4, that is, along to the length of a wall 12. In this drawing, the longitudinal limits between a wall and blocks 13 and 14 (see FIG. 4) have been indicated by vertical dotted lines 17. At the step illustrated in FIG. 5, after having eliminated insulating material 16 between walls 12 in the central portion thereof, a selective isotropic etching of intermediary insulating layer 16 comprised between silicon layers 3 and 5 has been performed. An upper silicon finger 21 is thus disengaged but insulating regions 16-1 and 16-2 remain under extensions of the silicon finger at the neighborhood of source and drain regions. An insulating coating is then formed around finger 21 to form an insulating ring designated in FIG. 5 with reference numeral 22. This insulator is formed by any selected means, for example, by thermal oxidation. In the same step, an insulator 23 has been formed on the upper side and around the apparent portions of a lower silicon finger 25 formed in silicon layer 3 and resting on insulating layer 2. At a same step or at a subsequent step, the exposed portions of insulating regions 16-1 and 16-2 are also coated with an insulator 24. The hollowed step initially occupied by the silicon-germanium region and then by insulating material 16 is designated with reference numeral 28.

Figure 6:
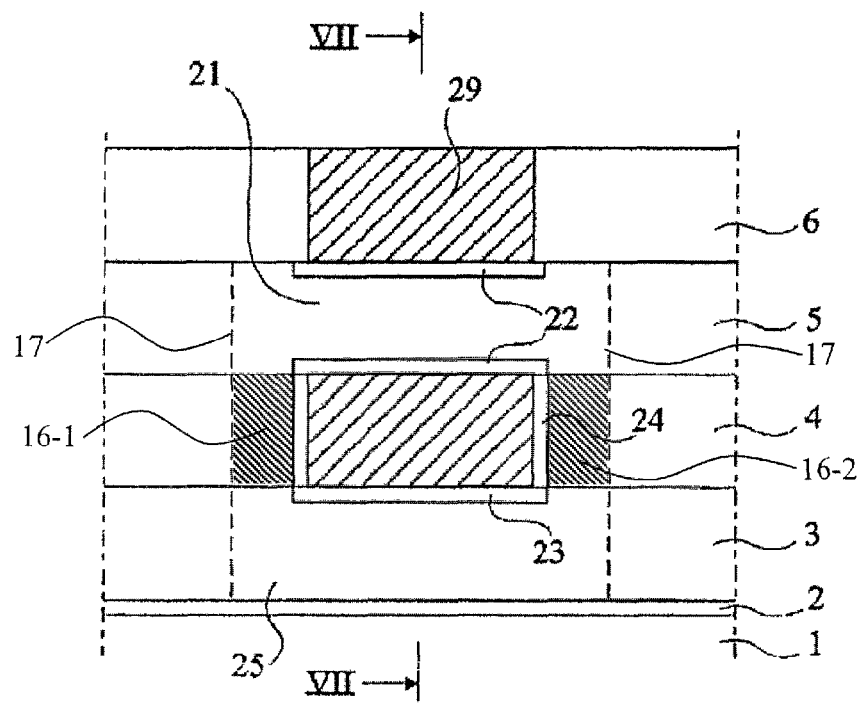
FIG. 6 is a cross-section view similar to that of FIG. 5 at a subsequent manufacturing stage.

At the next step, illustrated in FIG. 6, a filling with a conductive material is performed, which then fills all the intervals between fingers and hollowed portion 28 and which covers the structure. This conductive material may be a metal, or heavily-doped polysilicon, preferably at least partially turned into a metal silicide. A planarization, for example, by chem./mech. polishing, is then performed. A conductive ring 29 around the central portion of finger 21 is thus obtained, as illustrated in FIG. 6.

It will be understood the insulating regions 16-1 and 16-2 improve the isolation between the gates surrounding the fingers and the structures integral with the drain and source blocks. Thus the gate-source and gate-drain couplings is reduced. In the absence of insulating regions 16-1 and 16-2, the gate-source and gate-drain couplings would be higher, the silicon-germanium regions being more or less conductive, and being then separated from the gate only by the thin insulating layer 24.

Figure 7A:
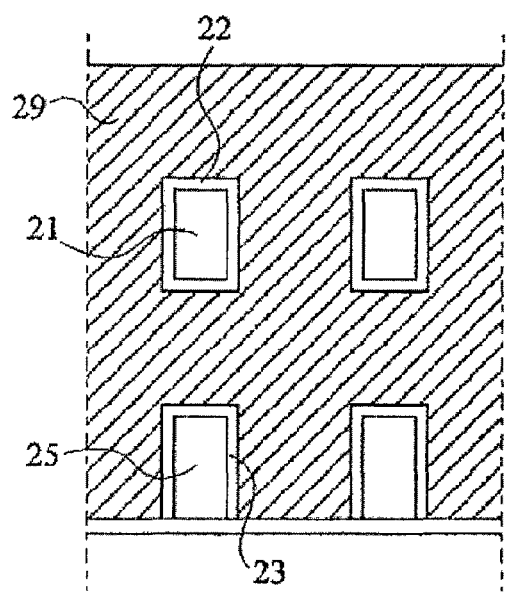
FIGS. 7A and 7B are cross-section views along line VII-VII of FIG. 4 of two alternative embodiments at a subsequent manufacturing step.

FIG. 7A is a cross-section view, in cross-section plane VII-VII illustrated in FIGS. 4 and 6, of the structure obtained at the step of FIG. 6. It shows in cross-section view upper silicon fingers 21 and lower silicon fingers 25. Fingers 21 and 25 are surrounded with insulator, respectively 22 and 23, and are embedded in the conductive layer formed of material 29.

The present invention is likely to have many variations which will be described hereafter, some of which are aspects of the present invention. It should be noted that these variations may be used separately or in combination.

Figure 7B:
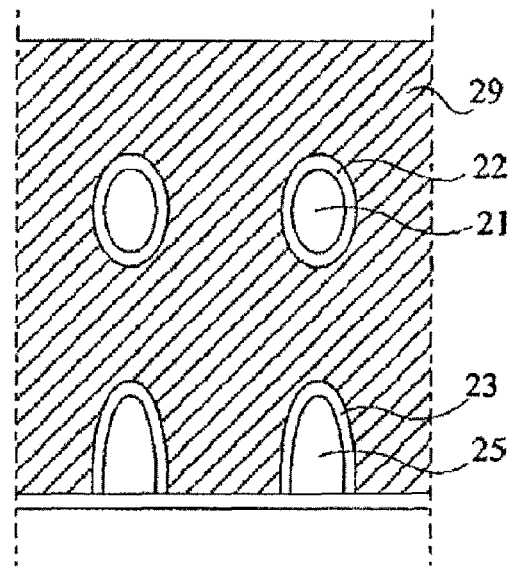

According to a first variation of the present invention, the result of which is illustrated in FIG. 7B, after having disengaged semiconductor fingers 21 at the steps described in relation with FIGS. 4 and 5, an anneal is performed to turn the fingers with substantially square or rectangular cross-sections into fingers with rounded, round, or oval cross-sections. The other steps of the present invention are unchanged. This variation provides a better quality still of control by the gate of the MOS transistor fingers. It should be noted that, according to an aspect of the present invention, the anneal occurs while only the active portions of the silicon fingers which will be surrounded with the control conductor overhang. Finger bending risks, which would appear if the fingers exhibited great lengths when overhanging, are thus limited.

According to a second variation of the present invention, it is aimed at eliminating lower fingers 25, to obtain a structure only comprising fingers 21 completely surrounded with a conductor. For this purpose, the present invention provides two ways.

The first way comprises the use of a structure in which layer 3 does not exist, that is, in which silicon-germanium 4 directly rests on an insulating support 2. In this case, all the previously-described steps may be used identically.

According to a second way, upper silicon layer 5 is not used. The structure then only comprises single-crystal silicon layer 3 coated with single-crystal silicon-germanium layer 4 and, instead of selectively etching the silicon-germanium with respect to silicon, the silicon is selectively etched with respect to the silicon-germanium. This structure, with silicon-germanium fingers, may become preferable, if oxidation and lateral silicon-germanium insulation methods are improved.

According to a third variation, an SOI-type structure with several stages in which a first insulating layer, a first semiconductor layer, a second insulating layer, and a second semiconductor layer, have been assembled on a substrate, is used as a starting structure. The fingers are obtained by selectively etching the insulator with respect to the semiconductor.

According to a fourth variation of the present invention, instead of providing a single stage of conductive fingers, several stages are provided by alternating the selectively-etchable semiconductor layers. For example, by making an Si—SiGe—Si—SiGe—Si—SiGe—Si . . . sandwich or an Si—SiO$_2$—Si—SiO$_2$—Si—SiO$_2$e-Si . . . sandwich. This method can be implemented without modifying whatsoever the previously-described steps of implementation of the present invention.

The present invention has been more specifically described in the context of the forming of a MOS transistor with parallel nanofingers. The present invention also enables forming bipolar transistors with parallel nanofingers. The method remains substantially the same, with the difference that the doping levels will be properly selected and that the control electrode, instead of being an insulated gate, will be a conductive portion (possibly a silicide) in direct contact with the central portion of each finger which then forms the base of the bipolar transistor.

The present invention easily lends itself to the forming of adapted dopings for the channel, source, and drain, or base, emitter, and collector regions. The doping steps may be provided at various stages of the method. These steps will not be detailed herein since they are quite apparent to those skilled in the art. LDD-type MOS transistor structures, comprising less doped source and drain regions in the immediate vicinity of the channel region may especially be formed, by using conventional techniques with spacers, or others.

Assemblies of semiconductors other than Si and SiGe may be used. A couple of materials such that one of these materials can be used as a support for the single-crystal growth of a semiconductor material and is selectively etchable with respect to the other must only be provided.

As an example of embodiment of the present invention, and only in the context of a specific technology, it should be noted, referring to FIG. 1, that silicon layers 3 and 5 may have thicknesses from 10 to 20 nm and silicon-germanium layer 4 has a thickness on the order of from 20 to 30 nm. The width of walls 12 may range from 10 to 20 nm. The interval between walls may range from 30 to 40 nm. The active portions of the fingers form a channel or base area and for example have a length on the order of from 5 to 30 nm.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for manufacturing a semiconductor device comprising:
   forming a single-crystal layer of a semiconductor material on a layer of an underlying material selectively etchable with respect to the single-crystal layer;
   etching parallel walls in the single-crystal layer and in the underlying layer;
   hollowing a portion of the underlying layer within the walls;
   substantially filling an interval between the walls and the hollowed portion with a first insulating material;
   delimiting a central portion of the walls;
   substantially eliminating the first insulating material around the central portion, wherein the first insulating material in the hollowed portion and within the central portion of the walls is substantially eliminated, whereby a finger of said semiconductor material is formed; and
   filling and coating the central portion with a conductive material.

2. The method of claim 1, wherein the walls have a width smaller than 100 nm.

3. The method of claim 1, wherein the method further comprises, before filling with a conductive material, insulating a periphery of the finger with a second insulating material.

4. The method of claim 3, wherein insulating comprises a thermal oxidation.

5. The method of claim 1, further comprising, before filling with the conductive material, performing an anneal to round the finger periphery.

6. The method of claim 1, wherein the semiconductor material comprises silicon and the underlying layer comprises silicon-germanium.

7. The method of claim 6, wherein the silicon-germanium layer rests on a thin lower silicon layer forming the upper portion of an SOI-type structure and wherein, in the finger formation step, fingers are also formed in the lower layer.

8. The method of claim 1, comprising providing several semiconductor finger stages.

9. The method of claim 2, wherein the walls have a width smaller than 50 nm.

10. A semiconductor device comprising:
    a semiconductor finger having a first end and a central portion;
    a layer distanced from the semiconductor finger;
    a first insulating material underlying the semiconductor finger, wherein the first insulating material substantially fills a space between the layer and the semiconductor finger from the first end to a central portion of the semiconductor finger.

11. The device of claim 10 further comprising a second semiconductor finger underlying and distanced from the first semiconductor finger.

12. The device of claim 10 further comprising a conductive material surrounding the central portion of the semiconductor finger.

13. The device of claim 12 further comprising a second insulating material disposed between the conductive material and the semiconductor finger.

14. The device of claim 10, wherein the semiconductor finger comprises silicon.

15. The device of claim 14, wherein the layer comprises silicon-germanium.

16. The device of claim 10, wherein the semiconductor finger has a rounded periphery.

17. The device of claim 10, wherein the semiconductor finger is formed on a silicon on insulator substrate.

18. A method for manufacturing a semiconductor comprising:
    forming a first semiconductor layer on a second layer;
    etching parallel walls in the first semiconductor layer and in the second layer;
    etching a portion of the second layer underlying the first layer within the parallel walls;
    filling a space between the walls and the underlying etched portion with a first insulating material;
    etching the first insulating material at a central portion of the walls, wherein the first insulating material in the underlying etched portion and within the central portion of the walls is etched, wherein a semiconductor finger said semiconductor material is formed.

19. The method of claim 18, wherein the walls have a width smaller than 100 nm.

20. The method of claim 19, wherein the walls have a width smaller than 50 nm.

21. The method of claim 18 further comprising filling the central portion between the walls with a conductive material.

22. The method of claim 21, further comprising, before filling with a conductive material, performing an anneal to round the finger periphery.

23. The method of claim 21, wherein the method further comprises, before filling with a conductive material, insulating a periphery of the finger with a second insulating material.

24. The method of claim 23, wherein insulating comprises a thermal oxidation.

25. The method of claim 18, wherein the first semiconductor layer comprises a silicon layer and the surface comprises silicon-germanium.

26. The method of claim 25, wherein the silicon-germanium layer rests on a thin lower silicon layer forming the upper portion of an SOI-type structure and wherein, in the finger formation step, fingers are also formed in the lower layer.

27. The method of claim 18, comprising providing several semiconductor finger stages.

28. The method of claim 18, wherein the first semiconductor layer is selectively etchable with respect to the second layer.

29. The method of claim 18, wherein the first insulating material is selectively etchable with respect to at least one of the first semiconductor layer and the second layer.

* * * * *

UNITED STATES PATENT AND TRADEMARK OFFICE
CERTIFICATE OF CORRECTION

PATENT NO. : 8,460,978 B2  
APPLICATION NO. : 12/063288  
DATED : June 11, 2013  
INVENTOR(S) : Philippe Coronel et al.

Page 1 of 1

It is certified that error appears in the above-identified patent and that said Letters Patent is hereby corrected as shown below:

In the Claims:

Claim 18, col. 6, lines 32-33, should read:
of the walls is etched, wherein a semiconductor finger is formed.

Signed and Sealed this
Twenty-third Day of July, 2013

Teresa Stanek Rea
*Acting Director of the United States Patent and Trademark Office*